United States Patent
Lu et al.

(10) Patent No.: US 9,317,646 B2
(45) Date of Patent: Apr. 19, 2016

(54) MASKS FORMED BASED ON INTEGRATED CIRCUIT LAYOUT DESIGN HAVING CELL THAT INCLUDES EXTENDED ACTIVE REGION

(71) Applicant: TAIWAN SEMICONDUCTOR MANUFACTURING COMPANY, LTD., Hsinchu (TW)

(72) Inventors: Lee-Chung Lu, Taipei (TW); Li-Chun Tien, Tainan (TW); Hui-Zhong Zhuang, Kaohsiung (TW); Chang-Yu Wu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/826,553

(22) Filed: Aug. 14, 2015

(65) Prior Publication Data

US 2015/0356225 A1    Dec. 10, 2015

Related U.S. Application Data

(62) Division of application No. 13/779,104, filed on Feb. 27, 2013, now Pat. No. 9,123,565.

(60) Provisional application No. 61/747,751, filed on Dec. 31, 2012.

(51) Int. Cl.
*G06F 17/50*      (2006.01)
*H01L 27/092*    (2006.01)
*H01L 27/02*      (2006.01)

(52) U.S. Cl.
CPC ........ *G06F 17/5072* (2013.01); *H01L 27/0207* (2013.01); *H01L 27/092* (2013.01)

(58) Field of Classification Search
CPC .............. H01L 27/092; H01L 27/0207; G06F 17/5072
See application file for complete search history.

(56) References Cited

U.S. PATENT DOCUMENTS

| | | | |
|---|---|---|---|
| 5,723,883 A | 3/1998 | Gheewalla | |
| 6,528,841 B2 | 3/2003 | Choi et al. | |
| 6,635,935 B2 | 10/2003 | Makino | |
| 6,958,939 B2 | 10/2005 | Hsieh et al. | |
| 6,974,729 B2 * | 12/2005 | Collaert | H01L 21/823821 257/365 |
| 7,679,106 B2 * | 3/2010 | Hamada | H01L 27/0207 257/202 |
| 7,808,051 B2 | 10/2010 | Hou et al. | |
| 7,821,039 B2 | 10/2010 | Tien et al. | |
| 8,026,536 B2 | 9/2011 | Yoshida | |
| 8,115,511 B2 * | 2/2012 | Or-Bach | H03K 19/17736 326/101 |
| 8,129,750 B2 | 3/2012 | Becker et al. | |
| 8,504,972 B2 | 8/2013 | Hou et al. | |
| 2006/0190893 A1 * | 8/2006 | Morton | G06F 17/5068 257/773 |
| 2007/0020858 A1 * | 1/2007 | Yang | H01L 27/0203 438/275 |
| 2008/0186059 A1 | 8/2008 | Nozoe | |
| 2010/0269081 A1 | 10/2010 | Hou et al. | |
| 2012/0106225 A1 | 5/2012 | Deng et al. | |

* cited by examiner

*Primary Examiner* — Naum B Levin
(74) *Attorney, Agent, or Firm* — Hauptman Ham, LLP

(57) ABSTRACT

A set of masks corresponds to an integrated circuit layout. The integrated circuit layout includes a first cell having a first transistor region and a second transistor region, and a second cell having a third transistor region and a fourth transistor region. The first cell and the second cell adjoin each other at side cell boundaries thereof, the first transistor region and the third transistor region are formed in a first continuous active region, and the second transistor region and the fourth transistor region are formed in a second continuous active region. The set of masks is formed based on the integrated circuit layout.

20 Claims, 8 Drawing Sheets

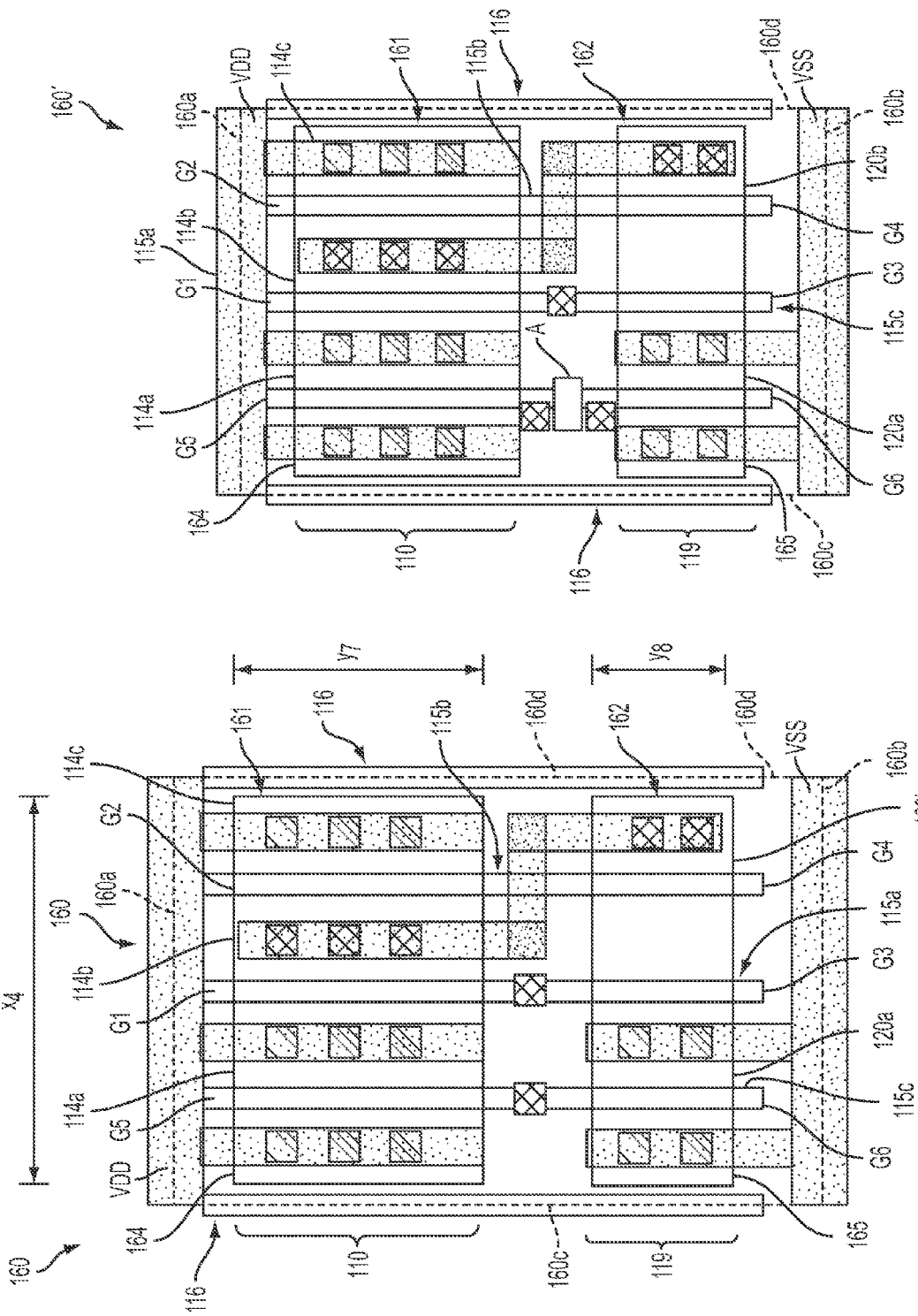

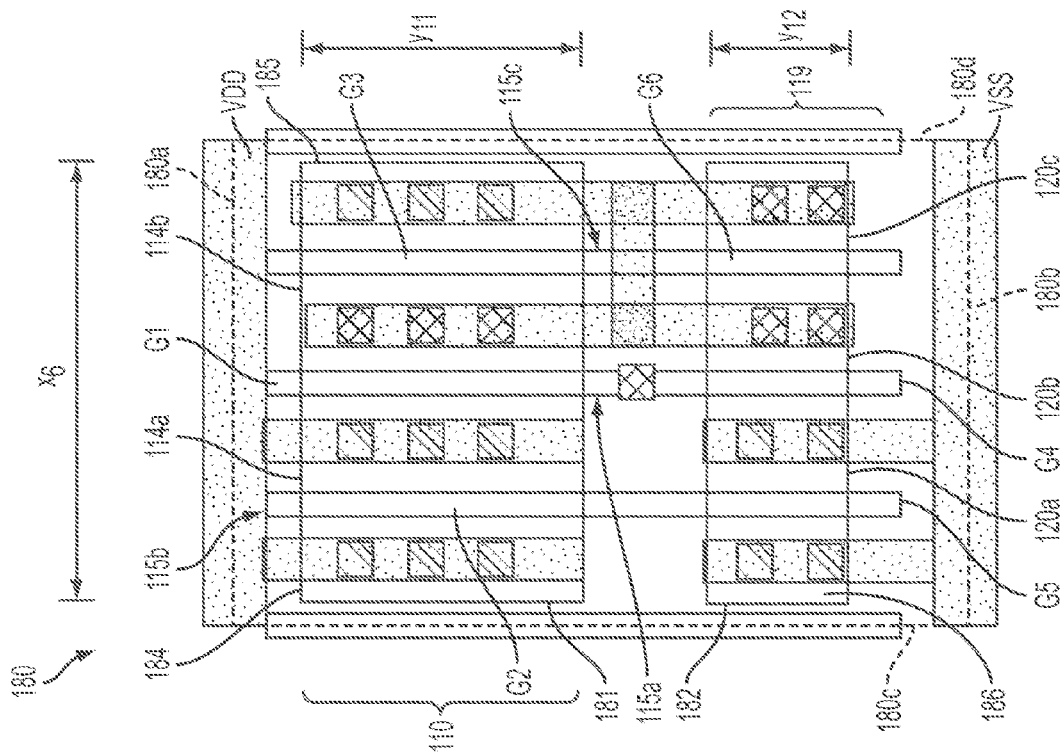

MASKS FORMED BASED ON INTEGRATED CIRCUIT LAYOUT DESIGN HAVING CELL THAT INCLUDES EXTENDED ACTIVE REGION

PRIORITY CLAIM

The present application is a divisional of U.S. application Ser. No. 13/779,104, filed Feb. 27, 2013, which claims the priority of U.S. Provisional Application No. 61/747,751, filed Dec. 31, 2012, which are incorporated herein by reference in their entireties.

BACKGROUND

In the design of integrated circuits, particularly digital circuits, standard cells having fixed functions are widely used. Standard cells are typically pre-designed and saved in cell libraries. During an integrated circuit design process, the standard cells are retrieved from the cell libraries and placed into desired locations. Routing is then performed to connect the standard cells with each other and with other circuits on the chip.

Pre-defined design rules are followed when placing the standard cells into the desired locations. For example, spacing the active regions apart from the cell boundaries, so that when neighboring cells are abutted, the active regions of neighboring cells will not adjoin each other. The precaution associated with the active regions; however, incurs area penalties. The reserved space between the active regions and the cell boundaries results in a significant increase in the areas of the standard cells. In addition, because the active regions are spaced apart from the cell boundaries, when the standard cells are placed abutting each other, the active regions will not be joined, even if some of the active regions in the neighboring cells need to be electrically coupled. The spaced apart active regions have to be electrically connected using metal lines. The performance of the resulting device is worse than if the active regions are continuous.

Layout patterns and configurations can affect yield and design performance of the standard cells.

BRIEF DESCRIPTION OF THE DRAWINGS

For a more complete understanding of the embodiments, and the advantages thereof, reference is now made to the following descriptions taken in conjunction with the accompanying drawings, in which:

FIG. 5 is a layout of a single standard cell having an extended active region and dummy poly biasing in accordance with one or more embodiments;

FIG. 6 is a layout of a single standard cell having an extended active region with active region biasing and separate dummy poly biasing in accordance with one or more embodiments;

FIG. 7 is a layout of a single standard cell having an extended active region and biasing at a drain region in accordance with one or more embodiments; and FIG. 8 is a layout of a single standard cell having an extended active region and biasing at a source region in accordance with one or more embodiments.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

One or more embodiments of integrated circuit design layouts including standard cells are shown. Throughout the various views and embodiments, like reference numbers are used to designate like elements. In some embodiments, an integrated circuit is manufactured by performing one or more lithographic processes, growing processes, etching processes, or other processes based on a set of masks. In some embodiments, a set of masks is fabricated based on an integrated circuit design layout that depicts a plurality of features of the integrated circuit in various component layers.

Figure 1A:
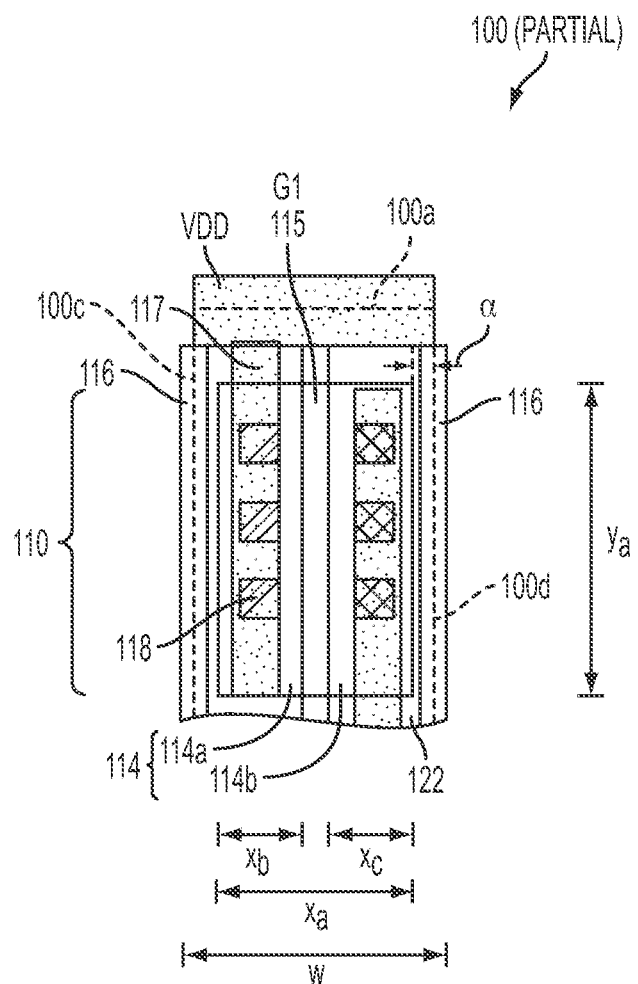
FIGS. 1A and 1B are a first transistor region and a second transistor region of a single standard cell in accordance with one or more embodiments.
Figure 1B:
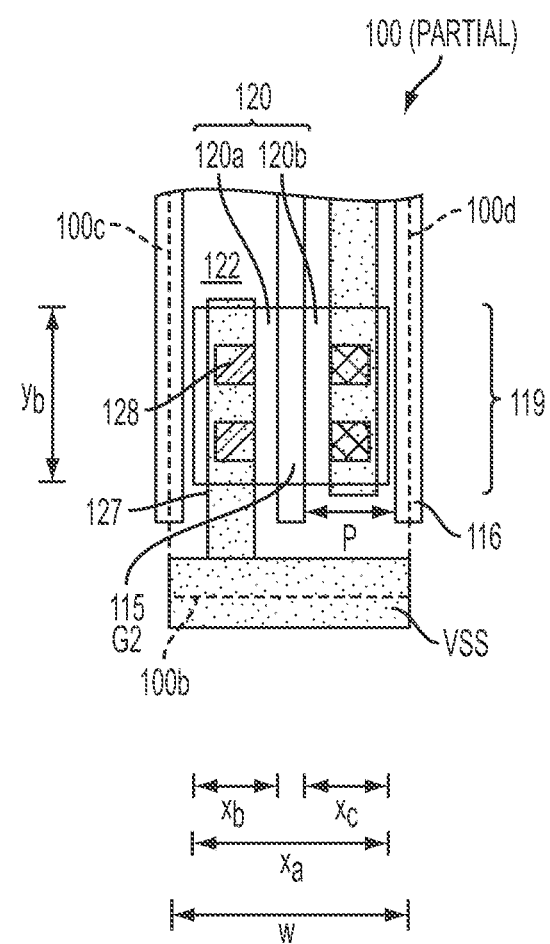

FIGS. 1A and 1B are a first transistor region and a second transistor region of a single standard cell in accordance with one or more embodiments.

In FIGS. 1A and 1B, according to one or more embodiments, portions of a single standard cell 100 (e.g., an inverter cell) are depicted separately for facilitating the illustration of the present disclosure. The present disclosure is not limited to generating layouts of inverter cells and is applicable for generating layouts of other types of circuits including, for example, AND, OR, XOR, XNOR gates, and the like.

The standard inverter cell 100 includes upper and lower boundaries 100a and 100b and left and right cell boundaries 100c and 100d as indicated by the dashed lines shown in FIGS. 1A and 1B. The first transistor region (e.g., a PMOS transistor 110) of the standard inverter cell 100 as shown in FIG. 1A includes a p-type active region 114 (as indicated by the dimensions $X_a$ by $Y_a$) including source region 114a (as indicated by the dimensions $X_b$ by $Y_a$) and drain region 114b (as indicated by the dimensions $X_c$ by $Y_a$) and a first portion of an active gate strip 115 as a gate $G_1$. The source and drain regions 114a and 114b are on opposite sides of gate $G_1$. Further, dummy gate strips 116 are placed at left and right boundaries 100c and 100d. Dummy gate strips 116 do not act as a gate to any transistors. Each dummy gate strip 116 has only one-half a width inside the standard inverter cell 100 and the other half is outside the standard inverter cell 100. Active gate strip 115 and dummy gate strips 116 are parallel to each other and equally spaced apart. Gate strip 115 and dummy gate strips 116 are formed of polysilicon or other conductive materials such as metals, metal alloys and metal silicides. Further, a VDD power supply line is connected to source region 114a by a metal connection (e.g., a metal line 117 and contact plug 118), and supplies a voltage level VDD.

The second transistor region (e.g., an NMOS transistor 119) of the standard inverter cell 100 as shown in FIG. 1B includes a second portion of gate strip 115 as a gate $G_2$ and an n-type active region (i.e., oxide-dimensioned region (OD)) 120 (as indicated by the dimensions $X_a$ by $Y_b$) including a source region 120a (as indicated by the dimensions $X_b$ by $Y_b$)

and a drain region 120b (as indicated by the dimensions $X_c$ by $Y_b$). Active regions 114 and 120 are spaced apart from each other by an isolation region 122 (e.g., a shallow trench isolation (STI) region) as shown in FIG. 1B. A VSS power supply line is connected to source region 120a by a metal connection (e.g., a metal line 127 and a contact plug 128) and supplies a ground level or negative voltage level. Gate strip 115 includes a gate pitch P which is measured from an edge of gate strip 115 to a respective edge of a neighboring gate strip (e.g., dummy gate 116).

A width "w" of standard inverter cell 100 is defined by a measurement from left to right boundaries 100c and 100d. The cell width is also referred to as the cell pitch. A length of standard inverter cell 100 is defined by the measurement from upper to lower boundaries 100a and 100b. In one or more embodiments, edges of active regions 114 and 120 are spaced apart from the right and left boundaries 100c and 100d by a distance a as shown in FIG. 1A.

Figure 2A:
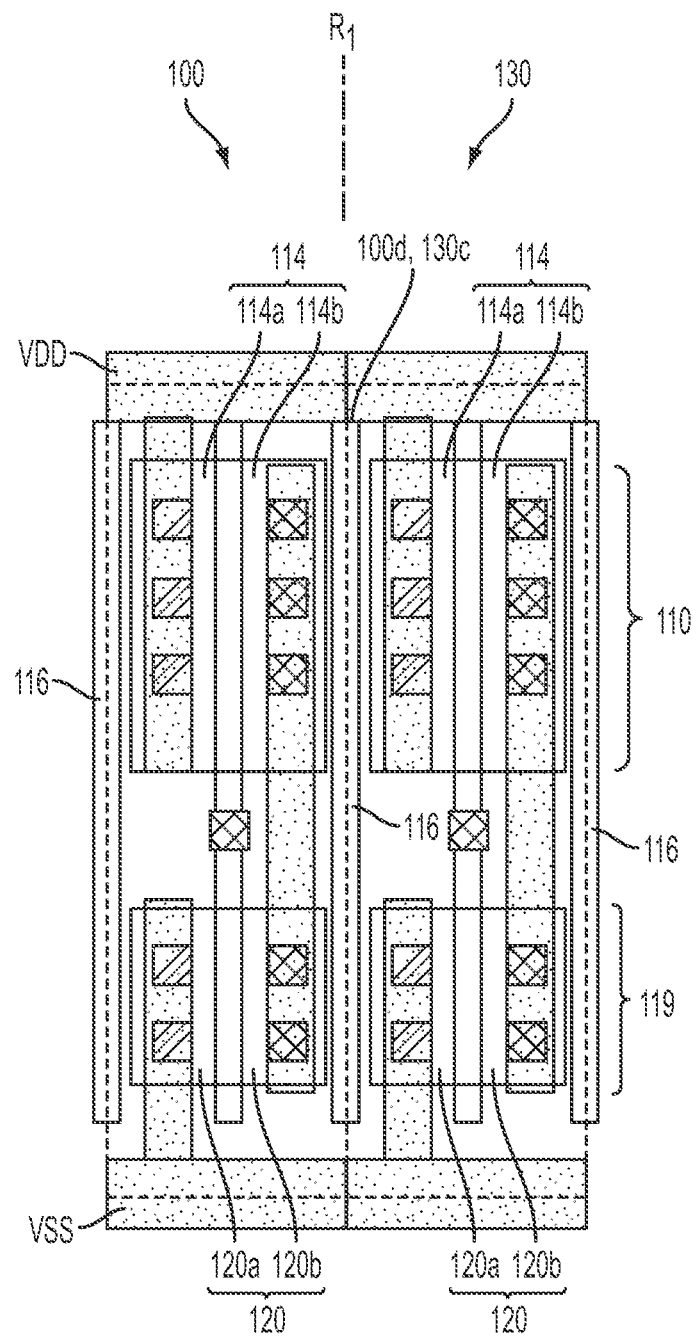
FIGS. 2A through 2C are layouts of different arrangements and types of standard cells in accordance with one or more embodiments.
Figure 2C:
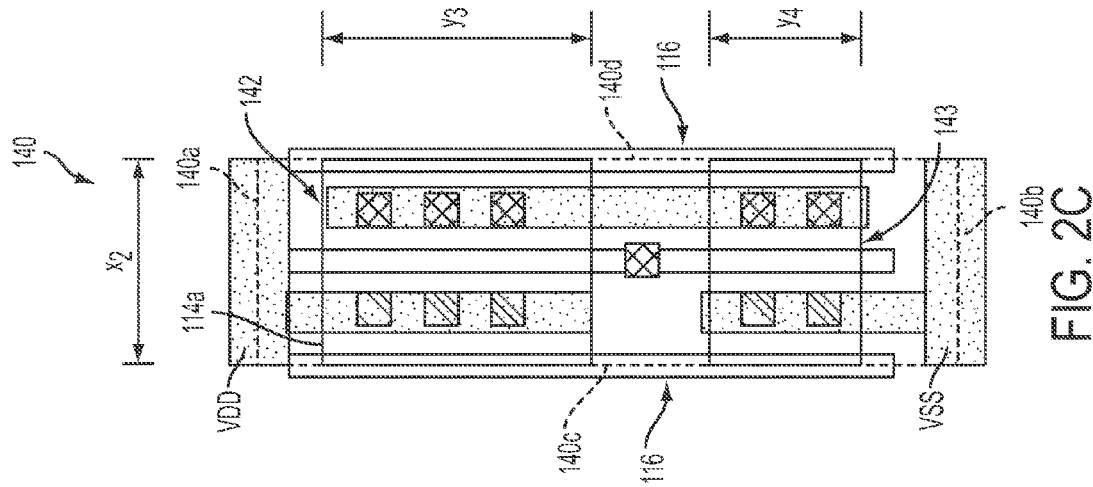
Figure 2B:
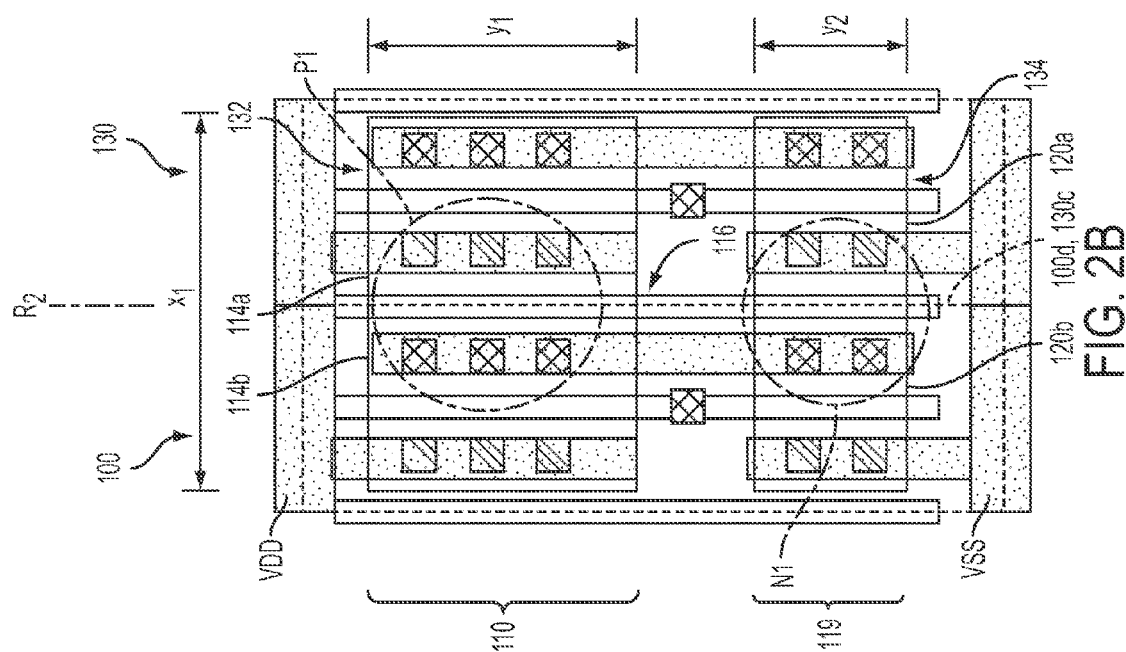

FIGS. 2A through 2C are layouts of different arrangements and types of standard cells in accordance with one or more embodiments.

In FIG. 2A, the single standard inverter cell 100 (on the left of reference line $R_1$) abuts another standard inverter cell 130 (on the right of reference line $R_1$). The standard cell 130 includes the same features as that of standard inverter cell 100 and therefore a detailed description thereof is omitted. The adjoining cells 100 and 130 are adjoined at their side boundaries (i.e., the right side boundary 100d of cell 100 and the left side boundary 130c of the cell 130). A dummy gate strip 116 is at the adjoining cell boundaries 100d and 130c, between the active regions 114 of the PMOS transistor regions 110 of both cells 100 and 130 and between the active regions 120 of the NMOS transistor regions 119 of both cells 100 and 130. As such, drain regions 114b and 120b of cell 100 are disposed to the left of the dummy gate strip 116, and source regions 114a and 120a of cell 130 are disposed to the right of the dummy gate strip 116.

Further, in one or more embodiments, the active regions 114 of the cells 100 and 130 are discrete (i.e., spaced apart from each other), and the active regions 120 of cells 100 and 130 are also discrete. In one or more embodiments, active regions of adjoining cells are continuous in FIG. 2B as explained below, to prevent area penalties, i.e., increased area usage, during a layout design process, and to increase gate density and the long OD region (LOD) effect. LOD effect refers the improved performance and reduced process variation as a result of a long, continuous OD region in comparison with a shorter, discrete OD region.

In FIG. 2B, standard inverter cells 100 (on the left of reference line $R_2$) and 130 (on the right of reference line $R_2$) are adjoined at side boundaries 100d and 130c. Further, the standard inverter cells 100 and 130 include a continuous active region 132 (as indicated by the dimensions $X_1$ by $Y_1$) in the PMOS transistor regions 110 and a continuous active region 134 (as indicated by dimensions $X_1$ by $Y_2$) in the NMOS transistor 119. The dummy gate strip 116 and adjacent drain region 114b of the standard inverter cell 100 and adjacent source region 114a of the standard inverter cell 130 together form a parasitic transistor (e.g., transistor P1 in the PMOS transistor region 110). The dummy gate strip 116 and adjacent drain region 120b and adjacent source region 120a together form a parasitic transistor (e.g., transistor N1 in the NMOS transistor region 119). As a result, unwanted capacitance exists between the parasitic transistors P1 and N1 because of these parasitic transistors P1 and N1 are within close proximity to each other. The resulting unwanted capacitance affects circuit performance.

Figure 9:
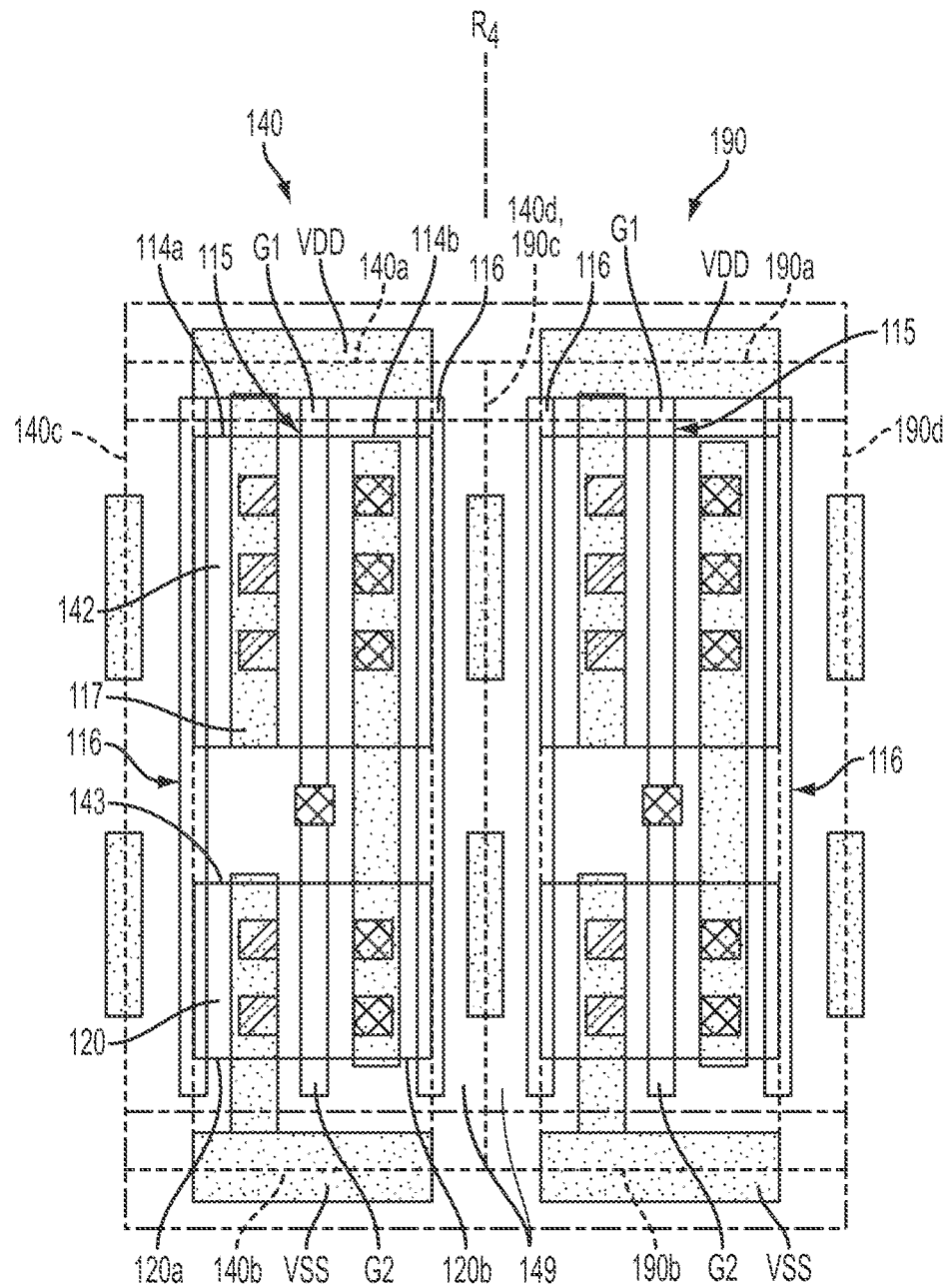
FIG. 9 is a layout of a pair of standard cells in accordance with one or more embodiments.

FIG. 2C is another example of a standard cell 140 according to one or more embodiments. The standard cell 140 is similar to the standard cell 100; however, in standard cell 140, an extended active region 142 (as indicated by the dimensions $X_2$ by $Y_3$) is included in the PMOS transistor region 110 and an extended active region 143 (as indicated by the dimensions $X_2$ by $Y_4$) is included in the NMOS transistor region 119. The standard cell 140 is referred to as a poly on OD edge (PODE) cell. As shown, extended active regions 142 and 143 extend over an edge of dummy gate strips 116 at side boundaries 140c and 140d of the standard cell 140. When two PODE type standard cells are abutted (as depicted in FIG. 9), a blank region 149 exists between the two cells such that the cells have discrete OD regions similar to that shown in FIG. 1B. In cases with devices where the edge of the OD regions have some sinking or recess effect, the use of PODE type standard cells resolve this issue by extending the poly to the OD edge. When the OD is recessed at the edge and other layers need to be placed above the recess, the device performance is potentially degraded. Thus, in order to avoid the OD recess, a poly is used to block the OD edge. If two PODE type standard cells abut each other, the devices should be separated (as depicted in FIG. 9).

Figure 3:
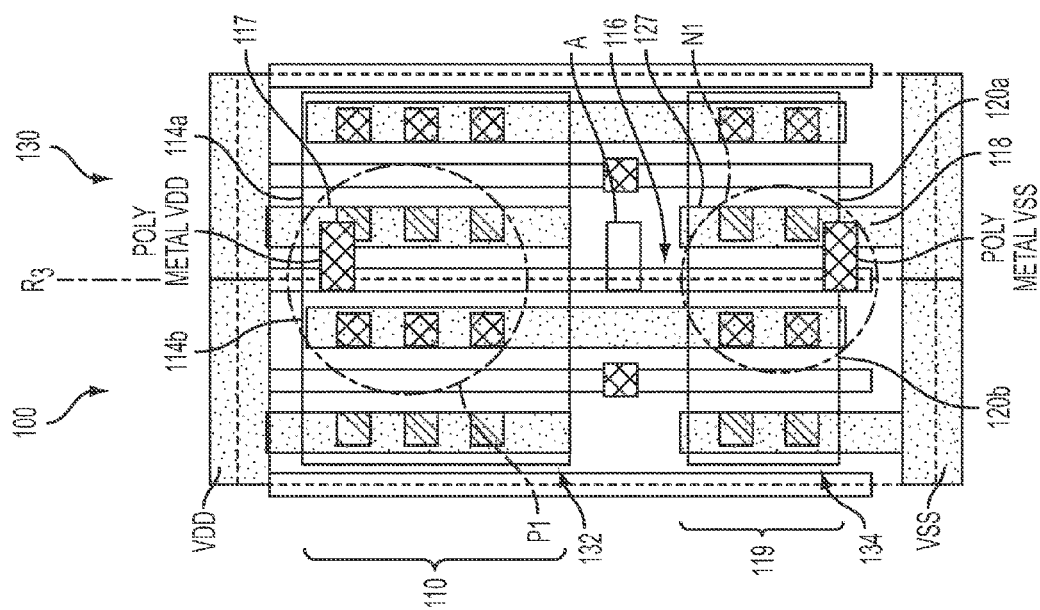
FIG. 3 is a layout of a pair of standard cells having continuous active regions in accordance with one or more embodiments.

FIG. 3 is a layout of an example variation of a combination of the standard cells 100 (on the left of reference line $R_3$) and 130 (on the right of reference line $R_3$) as similarly shown in FIG. 2B. The layout of FIG. 3 includes continuous active regions 132 and 134 and is used for illustrating an operation for eliminating parasitic capacitance within the continuous active regions 132 and 134.

As shown in FIG. 3, the standard cells 100 and 130 are the same as shown in FIG. 2B, therefore a description of the elements is omitted. In one or more embodiments, a poly cut is performed (as depicted by box A) to separate upper and lower portions of the dummy gate strip 116. The upper portion (i.e., the portion above box A) is electrically connected to the VDD power supply line and the lower portion (i.e., the portion below box A) is electrically connected to the VSS power supply line. The electrical connection to VDD and VSS is made by metal connections to turn off the parasitic transistors (P1 and N1). For example, poly metal VDD connection is used to electrically couple the VDD power supply line to a metal line 117 at the source region 114a of the second standard cell 130. Also, poly metal VSS connection is used to electrically couple the VSS power supply line to a metal line 127 at the source region 120a of the second standard cell 130.) The use of the continuous active regions 132 and 134 provides the benefit of regaining gate density and the LOD effect.

Figure 4:
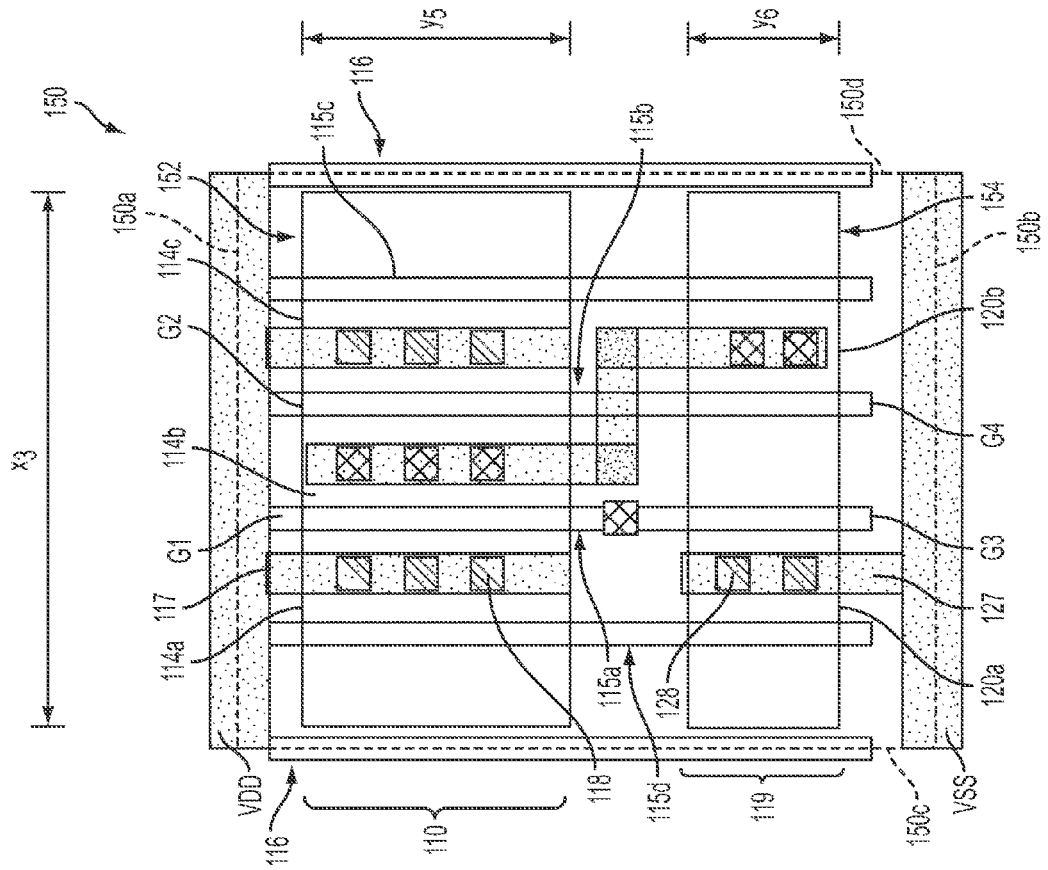
FIG. 4 is a layout of a single standard cell having an extended active region in accordance with one or more embodiments.

FIG. 4 is a layout of a standard cell 150 having an oxide diffusion (OD) extension layers including extended active regions 152 and 154 in accordance with one or more embodiments. The standard cell 150 in FIG. 4 is a single standard cell having OD extension layers and is similar to the standard cell 100 shown in FIGS. 1A and 1B except in the PMOS transistor region 110 includes three additional gate strips (115b, 115c, and 115d) and an additional source region 114c. The gate strip 115b is between and functions as the gate electrode for the drain region 114b and the additional source region 114c. The gate strip 115c can be used for connection with another device or as a dummy gate strip.

The standard cell 150 includes the first gate strip 115a, the second gate strip 115b, and the third gate strip 115c are in parallel with each other. Upper and lower boundaries 150a and 150b are at opposite ends of the standard cell 150, and left and right side boundaries 150c and 150d are parallel to the plurality of gate strips 115a, 115b and 115c. The PMOS transistor 110 comprises a first portion of the first gate strip 115a as a first gate $G_1$ and a first portion of the second gate strip 115b as a second gate $G_2$.

The PMOS transistor 110 further includes the extended active region 152 (as indicated by dimensions $X_3$ by $Y_5$) including a first source region 114a and a first drain region 114b at opposite sides of the first gate $G_1$, and the first drain region 114b and a second source region 114c at opposite sides of the second gate $G_2$. The active region 152 is extended by two gate pitches (i.e., one gate pitch on each side). The use of an extended active region allows the metal (M0) poly to be positioned in the active OD region and therefore there is no degradation regarding the device size.

Standard cell 150 further includes a NMOS transistor 119 including a second portion of the first gate strip 115a as a third gate $G_3$ and a second portion of the second gate strip 115b as a fourth gate $G_4$, the second extended active region 154 (as indicated by dimensions $X_3$ by $Y_6$) includes a third source region 120a opposite first source region 114a of the PMOS transistor 110 and adjacent to third gate $G_3$, and a second drain region 120b opposite second source region 114c and adjacent to fourth gate $G_4$.

First and second source regions 114a and 114c of PMOS transistor 110 are connected with VDD power supply line by metal connections (e.g., metal line 117 and contact plugs 118). Further, third source region 120a of NMOS transistor 119 is connected with VSS power supply line by a metal connection (e.g., metal line 127 and contact plug 128). In one or more embodiments, first gate strip 115a is an active gate strip and second gate strip 116 is a dummy gate strip. Further, according to one or more embodiments, gate strip 115d is a non-operative floating poly and gate strip 115c is an active gate strip for other devices (not shown).

In one or more embodiments, first drain region 114b of PMOS transistor 110 is electrically connected with second drain region 120b of NMOS transistor 119 by a metal connection.

FIG. 5 is a layout of a single standard cell 160 having extended active regions and dummy poly biasing to prevent parasitic capacitance in accordance with one or more embodiments. The layout of standard cell 160 is similar to the layout of standard cell 150 shown in FIG. 5. Compared with standard cell 150, PMOS transistor 110 and NMOS transistor 119 include extended active region 161 (as indicated by dimensions $X_4$ and $Y_7$) and extended active region 162 (as indicated by dimensions $X_4$ and $Y_8$) which are extended by one gate pitch at one side (e.g., a left side boundary 160c) of standard cell 160 instead of both sides. In the example depicted in FIG. 5, the active regions 161 and 162 are not extended beyond the third source region 114c of PMOS transistor 110 of standard cell 160 and second drain region 120b of NMOS transistor 119. Therefore, third source region 114c of PMOS transistor 110 of standard cell 160 and second drain region 120b of NMOS transistor 119 align near the side cell boundary 160d.

Standard cell 160 further includes a third gate strip 115c parallel to first gate strip 115a and includes an upper portion as a fifth gate $G_5$ and a lower portion as a sixth gate $G_6$. First and second dummy source regions 164 and 165 corresponding to PMOS transistor 110 and NMOS transistor 119 are defined within the extension of the active regions 161 and 162. First and second dummy source regions 164 and 165 are disposed to the left of the third gate strip 115c and adjacent to a side boundary (e.g., the left side boundary 160c). VDD power supply line is electrically connected to first dummy source region 164 and VSS power supply line is electrically connected to second dummy source region 165 by metal connections. Use of first and second dummy source regions 164 and 165 at boundary 160c prevents the generation of parasitic capacitance, and protects the source region 114a and the LOD effect as a result of the extended active regions 161 and 162.

In one or more embodiments, third gate strip 115c is a dummy gate strip and is biased at VDD power supply line or the VSS power supply line.

In some embodiments, some or all layouts of standard cells for NOT, AND, OR, XOR, or XNOR gates, and/or the like are arranged in a manner that the source regions are positioned adjacent to the cell side boundaries, such as side boundaries 160c and 160d of cell 160. Accordingly, generation of parasitic transistors at the side boundaries 160c and 160d when abutting another cell is prevented.

FIG. 6 is a layout of single standard cell 160' with active region biasing and separate dummy poly biasing in accordance with one or more embodiments. In FIG. 6, compared with the standard cell 160 in FIG. 5, a poly cut is performed (as depicted box "A") at fifth gate $G_5$ and sixth gate $G_6$ and fifth gate $G_5$ is electrically connected with VDD power supply line by a metal connection, and sixth gate $G_6$ is electrically connected with VSS power supply line by a metal connection. Since the fifth gate $G_5$ and the sixth gate $G_6$ are cut, and the fifth gate $G_5$ which corresponds to a parasitic transistor, is connected to power, the connection of fifth gate $G_5$ to power disables the fifth gate $G_5$ Further, sixth gate $G_6$ is connected to ground and is not used as a transistor.

FIG. 7 is a layout of a single standard cell 170 having extended active region 171 (as indicated by dimensions $X_5$ by $Y_9$) and extended active region 172 (as indicated by dimensions $X_5$ by $Y_{10}$) in accordance with one or more embodiments. Active regions 171 and 172 are extended by one gate pitch at a right side of standard cell 170. Some of the elements within standard cell 170 are the same as standard cell 160 therefore a description thereof is omitted.

In FIG. 7, third gate strip 115c is parallel to and adjacent to second gate strip 115b and includes the upper portion as the fifth gate $G_5$ and the lower portion as the sixth gate $G_6$. First and second dummy source regions 174 and 175 are defined within the corresponding active regions 171 and 172 and are disposed to the right of the gate strip 115c along a side boundary 170d of standard cell 170. First dummy source region 174 and second source region 114c are at opposite sides of fifth gate $G_5$, and second dummy source region 175 and second drain region 120b are at opposite sides of sixth gate $G_6$. VDD power supply line is electrically connected to first dummy source region 174 and VSS power supply line is electrically connected to second dummy source region 175. As shown in FIG. 7, in one or more embodiments, source region 175 is electrically coupled to VSS (i.e., also referred to as biasing performed at a drain side of NMOS transistor 119). Third gate strip 115c is connected with VSS power supply line to effectively disable the parasitic transistor formed by the drain region 120b, the source region 175, and the gate $G_6$.

FIG. 8 is a layout of a single standard cell 180 having an extended active region 181 (as indicated by dimensions $X_6$ by $Y_{11}$) and an extended active region 182 (as indicated by dimensions $X_6$ by $Y_{12}$) and performing biasing at a source region in accordance with one or more embodiments.

In FIG. 8, standard cell 180 is an inverter, for example, and includes first, second and third gate strips 115a, 115b and 115c parallel with each other. Upper and lower boundaries 180a and 180b on opposite ends of standard cell 180 and left and right side boundaries 180c and 180d parallel to first, second and third gates 115a, 115b and 115c. A PMOS transistor 110 includes a first portion of first gate strip 115a as a first gate $G_1$, first extended active region 181 including a first source region 114a and a first drain region 114b at opposite sides of first gate $G_1$, a first portion of second gate strip 115b as a second gate $G_2$, a first dummy source region 184 and first source region 114a disposed opposite second gate $G_2$, and a first portion of third gate strip 115c as a third gate $G_3$ and a second dummy source region 185 and first drain region 114b disposed opposite third gate $G_3$.

Standard cell 180 further includes NMOS transistor 119 including a second portion of first gate strip 115a as a fourth gate $G_4$, second extended active region 182 including a second source region 120a opposite first source region 114a and second source region 120a and second drain region 120b disposed at opposite sides of the fourth gate $G_4$. A second portion of second gate strip 115b as a fifth gate $G_5$, and a third dummy source region 186 and second source region 120a are disposed at opposite sides of the fifth gate $G_5$, and a second portion of third gate strip 120c as a sixth gate $G_6$, the second drain region 120b and a third drain region 120c are disposed at opposite sides of sixth gate $G_6$. First dummy source region 184, second dummy source region 185 and first source region 114a are connected with VDD power supply line by metal connections, and third dummy source region 186, and second source region 120a are connected with the VSS power supply line by metal connections. As shown, first, second and third source regions 184, 185 and 186 are disposed along the side boundaries 180c and 180d of standard cell 180. Biasing is performed on the source side of the standard cell 180. The first, second and third drain regions 114b, 120b and 120c are connected together and act as an output of the inverter.

FIG. 9 illustrates a pair of PODE type standard cells according to one or more embodiments. As shown in FIG. 9, two PODE type standard cells 140 (on the left of reference line $R_4$) and 190 (on the right of reference line $R_4$) are provided. Details regarding the standard cell 140 are discussed above with regards to FIG. 2C. Standard cell 190 has cell boundaries 190a, 190b, 190c and 190d and further comprises the same components as that of standard cell 140, therefore a detailed description of standard cell 190 is omitted to avoid unnecessary repetition. As mentioned above, when PODE type standard cells 140 and 190 are abutted as shown in FIG. 9, blank region 149 exists between the two cells such that the cells have discrete OD regions similar to that shown in FIG. 2A.

One or more embodiments include a set of masks corresponding to an integrated circuit layout. The integrated circuit layout comprises a first cell comprising a first transistor region and a second transistor region, and a second cell comprising a third transistor region and a fourth transistor region. The first cell and the second cell adjoin each other at side cell boundaries thereof, the first transistor region and the third transistor region are formed in a first continuous active region, and the second transistor region and the fourth transistor region are formed in a second continuous active region. The set of masks is formed based on the integrated circuit layout.

One or more embodiments include a set of masks corresponding to an integrated circuit layout. The integrated circuit layout comprises a first cell comprising a first active region and a first side boundary, and a second cell comprising a second active region and a second side boundary along the first side boundary. The integrated circuit layout further comprises a first gate strip in the first cell parallel to the first side boundary and overlying the first active region, a second gate strip in the second cell parallel to the second side boundary and overlying the second active region, and a dummy gate strip parallel to and between the first gate strip and the second gate strip, wherein the dummy gate strip overlies at least one of the first active region or the second active region. The set of masks is formed based on the integrated circuit layout.

One or more embodiments include a set of masks corresponding to an integrated circuit layout. The integrated circuit layout comprises a first cell comprising a first active region and a first side boundary, and a second cell comprising a second active region and a second side boundary along the first side boundary. The integrated circuit layout further comprises a first gate strip in the first cell parallel to the first side boundary and overlying the first active region, a second gate strip in the second cell parallel to the second side boundary and overlying the second active region, a blank region abutting the first active region and the second active region, a first dummy gate strip in the first cell between the first gate strip and the first side boundary, and overlying the first active region and the blank region, and a second dummy gate strip in the second cell between the second gate strip and the second side boundary, and overlying the second active region and the blank region. The set of masks is formed based on the integrated circuit layout.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A set of masks corresponding to an integrated circuit layout, the integrated circuit layout comprising:
   a first cell comprising a first transistor region and a second transistor region;
   a second cell comprising a third transistor region and a fourth transistor region,
   wherein
   the first cell and the second cell adjoin each other at side cell boundaries thereof,
   the first transistor region and the third transistor region are formed in a first continuous active region, and
   the second transistor region and the fourth transistor region are formed in a second continuous active region; and
   a middle gate strip extending from the first transistor region to the second transistor region, along a line at which the first cell adjoins the second cell,
   wherein the set of masks is formed based on the integrated circuit layout.

2. The set of masks of claim 1, wherein the first cell further comprises:
   a first gate strip; and
   upper and lower cell boundaries on opposite ends of the first cell, wherein
the side cell boundaries are parallel to the first gate strip;
the first transistor region comprises a first PMOS transistor comprising a first portion of the first gate strip as a first gate, a first source region and a first drain region adjacent to the first gate, and
the second transistor region comprises a first NMOS transistor comprising a second portion of the first gate strip as a second gate, and a second source region and a second drain region adjacent to the second gate.

3. The set of masks of claim 2, wherein the second cell further comprises:
a second gate strip parallel to the first gate strip; and
upper and lower cell boundaries on opposite sides of the second cell,
wherein
the third transistor region comprises a second PMOS transistor comprising a first portion of the second gate strip as a third gate, and a third source region and a third drain region adjacent to the third gate, and
the fourth transistor region comprises a second NMOS transistor comprising a second portion of the second gate strip as a fourth gate, and a fourth source region and a fourth drain region adjacent to the fourth gate.

4. The set of masks of claim 3, wherein the first gate strip and the second gate strips are active gate strips and the middle gate strip is a dummy gate strip.

5. The set of masks of claim 3, wherein the integrated circuit layout further comprises:
a first power supply line extending across the upper cell boundaries of the first cell and the second cell; and
a second power supply line extending across the lower cell boundaries of the first cell and the second cell,
wherein the first power supply line is electrically coupled to the first source region and the third source region and the second power supply line is electrically coupled to the second source region and the fourth source region.

6. The set of masks of claim 5, wherein:
an upper portion of the middle gate strip, the first drain region, and the third source region form a parasitic transistor;
a lower portion of the middle gate strip, the second drain region, and the fourth source region form a parasitic transistor;
the upper portion of the middle gate strip is electrically coupled to the first power supply line; and
the lower portion of the middle gate strip is electrically coupled to the second power supply line.

7. The set of masks of claim 1, wherein:
the first cell further comprises a first dummy gate strip along the side cell boundary opposite to the middle gate strip and the second cell further comprises a second dummy gate strip along the side cell boundary opposite to the middle gate strip.

8. The set of masks of claim 1, wherein:
the first continuous active region extends to the side cell boundaries of the first cell, and the second continuous active region extends to the side cell boundaries of the second cell.

9. A set of masks corresponding to an integrated circuit layout, the integrated circuit layout comprising:
a first cell comprising a first active region and a first side boundary;
a second cell comprising a second active region and a second side boundary along the first side boundary;
a first gate strip in the first cell parallel to the first side boundary and overlying the first active region;
a second gate strip in the second cell parallel to the second side boundary and overlying the second active region; and
a dummy gate strip parallel to and between the first gate strip and the second gate strip,
wherein the dummy gate strip overlies one of the first active region or the second active region,
wherein the set of masks is formed based on the integrated circuit layout.

10. The set of masks of claim 9, wherein:
the first cell further comprises a third active region,
the second cell further comprises a fourth active region,
when the dummy gate strip overlies the first active region, the dummy gate strip also overlies the third active region, and
when the dummy gate strip overlies the second active region, the dummy gate strip also overlies the fourth active region.

11. The set of masks of claim 9, wherein the integrated circuit layout further comprises a first power supply line along a direction perpendicular to the dummy gate strip, wherein the first active region comprises a first source region electrically coupled to the first power supply line.

12. The set of masks of claim 11, wherein the integrated circuit layout further comprises a second power supply line along the direction perpendicular to the dummy gate strip, wherein the second active region comprises a second source region electrically coupled to the second power supply line.

13. The set of masks of claim 12, wherein the first power supply line is electrically coupled to the second power supply line.

14. The set of masks of claim 12, wherein the first power supply line is electrically separate from the second power supply line.

15. A set of masks corresponding to an integrated circuit layout, the integrated circuit layout comprising:
a first cell comprising a first active region and a first side boundary;
a second cell comprising a second active region and a second side boundary along the first side boundary;
a first gate strip in the first cell parallel to the first side boundary and overlying the first active region;
a second gate strip in the second cell parallel to the second side boundary and overlying the second active region;
a blank region abutting the first active region and the second active region;
a first dummy gate strip in the first cell between the first gate strip and the first side boundary, and overlying the first active region and the blank region; and
a second dummy gate strip in the second cell between the second gate strip and the second side boundary, and overlying the second active region and the blank region,
wherein the set of masks is formed based on the integrated circuit layout.

16. The set of masks of claim 15, wherein the first dummy gate strip overlies a border between the first active region and the blank region.

17. The set of masks of claim 15, wherein:
the first cell further comprises a third active region,
the second cell further comprises a fourth active region,
the first dummy gate strip overlies the third active region, and
the second dummy gate strip overlies the fourth active region.

18. The set of masks of claim 17, wherein:
the first dummy gate strip overlies a first edge of the blank region, and the first active region and the third active region abut the first edge of the blank region.

19. The set of masks of claim 18, wherein:
the second dummy gate strip overlies a second edge of the blank region, and
the second active region and the fourth active region abut the second edge of the blank region.

20. The set of masks of claim 15, wherein the second side boundary is along the first side boundary in the blank region.

* * * * *